(12) United States Patent
Cheng et al.

(10) Patent No.: US 12,166,104 B2
(45) Date of Patent: *Dec. 10, 2024

(54) GATE STRUCTURE AND METHODS THEREOF

(71) Applicant: Taiwan Semiconductor Manufacturing Co., Ltd., Hsinchu (TW)

(72) Inventors: Anhao Cheng, Taichung (TW); Fang-Ting Kuo, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/357,509

(22) Filed: Jul. 24, 2023

(65) Prior Publication Data

US 2023/0369450 A1    Nov. 16, 2023

Related U.S. Application Data

(62) Division of application No. 17/576,727, filed on Jan. 14, 2022, now Pat. No. 11,799,014, which is a (Continued)

(51) Int. Cl.
  *H01L 29/76* (2006.01)
  *H01L 21/8234* (2006.01)
  (Continued)

(52) U.S. Cl.
  CPC .............. *H01L 29/66484* (2013.01); *H01L 21/823462* (2013.01); *H01L 21/823481* (2013.01);
  (Continued)

(58) Field of Classification Search
  CPC ........ H01L 29/66484; H01L 21/823462; H01L 21/823481; H01L 21/823814;
  (Continued)

(56) References Cited

U.S. PATENT DOCUMENTS 6,828,183 B1    12/2004    Sung
7,253,114 B2    8/2007    Chen
(Continued)

FOREIGN PATENT DOCUMENTS

CN    103545360 A    1/2014
CN    103811549 A    5/2014
(Continued)

*Primary Examiner* — Theresa T Doan
(74) *Attorney, Agent, or Firm* — Haynes and Boone, LLP

(57) ABSTRACT

A method and structure providing a high-voltage transistor (HVT) including a gate dielectric, where at least part of the gate dielectric is provided within a trench disposed within a substrate. In some aspects, a gate oxide thickness may be controlled by way of a trench depth. By providing the HVT with a gate dielectric formed within a trench, embodiments of the present disclosure provide for the top gate stack surface of the HVT and the top gate stack surface of a low-voltage transistor (LVT), formed on the same substrate, to be substantially co-planar with each other, while providing a thick gate oxide for the HVTs. Further, because the top gate stack surface of HVT and the top gate stack surface of the LVT are substantially co-planar with each other, over polishing of the HVT gate stack can be avoided.

20 Claims, 7 Drawing Sheets

Related U.S. Application Data division of application No. 16/587,003, filed on Sep. 29, 2019, now Pat. No. 11,227,935, which is a division of application No. 15/884,903, filed on Jan. 31, 2018, now Pat. No. 10,431,664.

(60) Provisional application No. 62/527,665, filed on Jun. 30, 2017.

(51) Int. Cl.

| | | |
|---|---|---|
| *H01L 21/8238* | (2006.01) | |
| *H01L 27/092* | (2006.01) | |
| *H01L 29/66* | (2006.01) | |
| *H01L 29/94* | (2006.01) | |
| *H01L 49/02* | (2006.01) | |
| *H03K 19/0185* | (2006.01) | |

(52) U.S. Cl.
CPC .......... *H01L 21/823814* (2013.01); *H01L 21/823857* (2013.01); *H01L 27/0922* (2013.01); *H01L 28/40* (2013.01); *H01L 29/66492* (2013.01); *H03K 19/018521* (2013.01); *H01L 21/823878* (2013.01)

(58) Field of Classification Search
CPC ......... H01L 21/823857; H01L 27/0922; H01L 28/40; H01L 29/66492; H01L 21/823878; H01L 29/517; H01L 27/088; H01L 29/42364; H01L 29/513; H01L 29/66621; H01L 21/823418; H01L 29/401; H01L 29/4236; H01L 29/78; H01L 21/304; H01L 21/31051; H01L 21/32055; H01L 21/3213; H03K 19/018521
USPC .......................................................... 257/368
See application file for complete search history.

(56) References Cited

U.S. PATENT DOCUMENTS

| | | |
|---|---|---|
| 7,362,136 B2 | 4/2008 | Chen |
| 7,960,810 B2 | 6/2011 | Huang |
| 8,338,243 B2 | 12/2012 | Huang |
| 8,669,150 B2 | 3/2014 | Huang |
| 9,209,272 B2 | 12/2015 | Liu |
| 9,564,511 B2 | 2/2017 | Liu |
| 9,780,210 B1 | 10/2017 | Goktepeli |
| 10,431,664 B2 * | 10/2019 | Cheng ............. H01L 21/823481 |
| 11,227,935 B2 | 1/2022 | Cheng |
| 2009/0014807 A1 | 1/2009 | Tang |
| 2013/0234244 A1 | 9/2013 | Liu |
| 2016/0276342 A1 | 9/2016 | Lim |
| 2016/0358913 A1 | 12/2016 | Kim |

FOREIGN PATENT DOCUMENTS

| | | |
|---|---|---|
| CN | 106298485 A | 1/2017 |
| CN | 106328507 A | 1/2017 |
| CN | 106981485 A | 7/2017 |
| JP | 2005252263 A | 9/2005 |

* cited by examiner

GATE STRUCTURE AND METHODS THEREOF

CROSS-REFERENCE TO RELATED APPLICATIONS

This application is a divisional of U.S. patent application Ser. No. 17/576,727, filed Jan. 14, 2022, which is a divisional of U.S. patent application Ser. No. 16/587,003, filed Sep. 29, 2019, now U.S. Pat. No. 11,227,935, which is a divisional of U.S. patent application Ser. No. 15/884,903, filed Jan. 31, 2018, now U.S. Pat. No. 10,431,664, which claims the benefit of U.S. Provisional Application No. 62/527,665, filed Jun. 30, 2017, the entireties of which are incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

A particular challenge, and one which has become increasingly difficult for reduced device geometries, relates to the substrate planarization requirements during device fabrication. Chemical mechanical polishing (CMP), a process that serves to remove substrate material and thus planarize a surface of the substrate, is a process that is used throughout the semiconductor industry to address such substrate planarization requirements. However, in various situations, a CMP process alone is inadequate, and in fact could be detrimental, to some semiconductor substrates that include a variety of semiconductor device types. For example, a semiconductor substrate may in some cases include both high-voltage transistors (HVTs) and low-voltage transistors (LVTs). In some cases, the HVTs may be formed within a high-voltage (HV) region of the substrate, and the LVTs may be formed within a low-voltage (LV) region of the same substrate. In at least some examples, the HVTs have a substantially thicker gate dielectric than the LVTs. As a result, a top gate stack surface of the HVTs and LVTs may not be co-planar with each other. Thus, in some cases, a metal gate CMP process that polishes down to a top surface of the shorter LVT gate stack may simultaneously over polish the HVT gate stack, thereby damaging the HVT gate stack.

Thus, existing processes have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
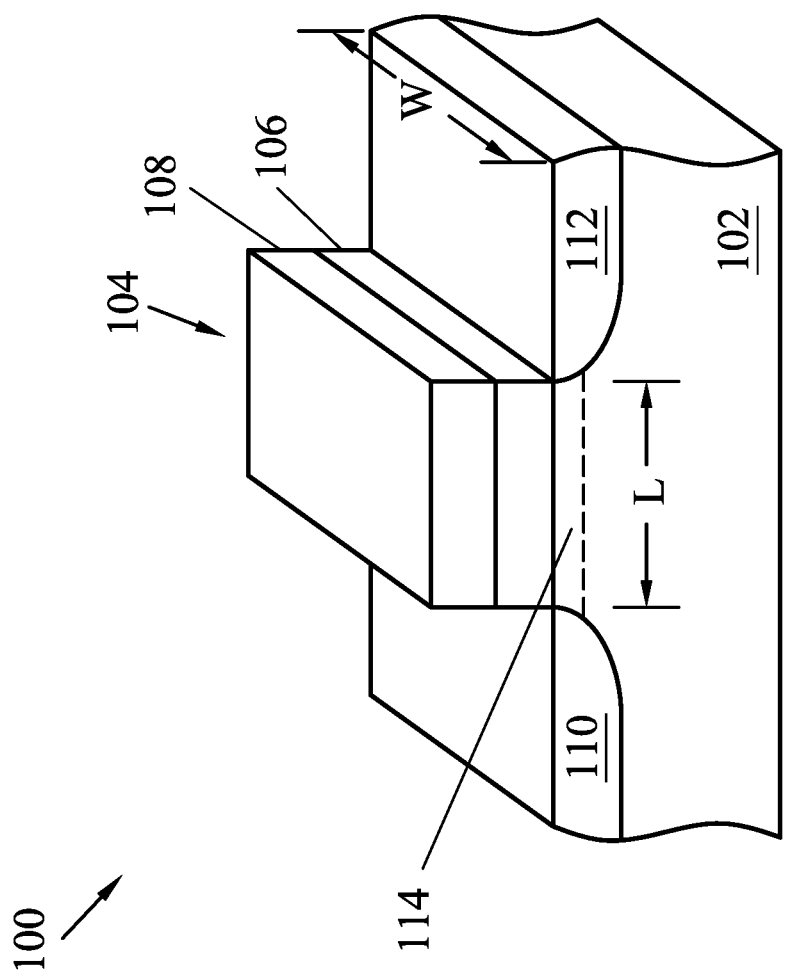
FIG. 1 is perspective view of an embodiment of a transistor device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments which may be employed in any of a variety of semiconductor device types. For example, embodiments of the present disclosure may be used in planar bulk metal-oxide-semiconductor field-effect transistors (MOSFETs), strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure.

Referring first to the example of FIG. 1, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 130. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr)$TiO_3$ (BST), $Al_2O_3$. $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 106 may include silicon dioxide or other suitable dielectric. The gate dielectric 106 may be formed by ALD, physical vapor deposition (PVD), CVD, oxidation, and/or other suitable methods. In some embodiments, the gate electrode 108 may be deposited as part of a gate first or gate last (e.g., replacement gate) process. In various embodiments, the gate electrode 108 includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 104 may provide a gate electrode for the transistor 100, including both N-type and P-type devices. In some embodiments, the gate electrode 108 may alternately or additionally include a polysilicon layer. In various examples, the gate electrode 108 may be formed using PVD, CVD, electron beam (e-beam) evaporation, and/or other suitable process. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown regions, or a combination thereof. The channel region 114 of the transistor 100 is defined as the region between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114. In some examples, the channel region 114 includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2$/V−s and a hole mobility of around 480 $cm^2$/V−s.

Figure 2:
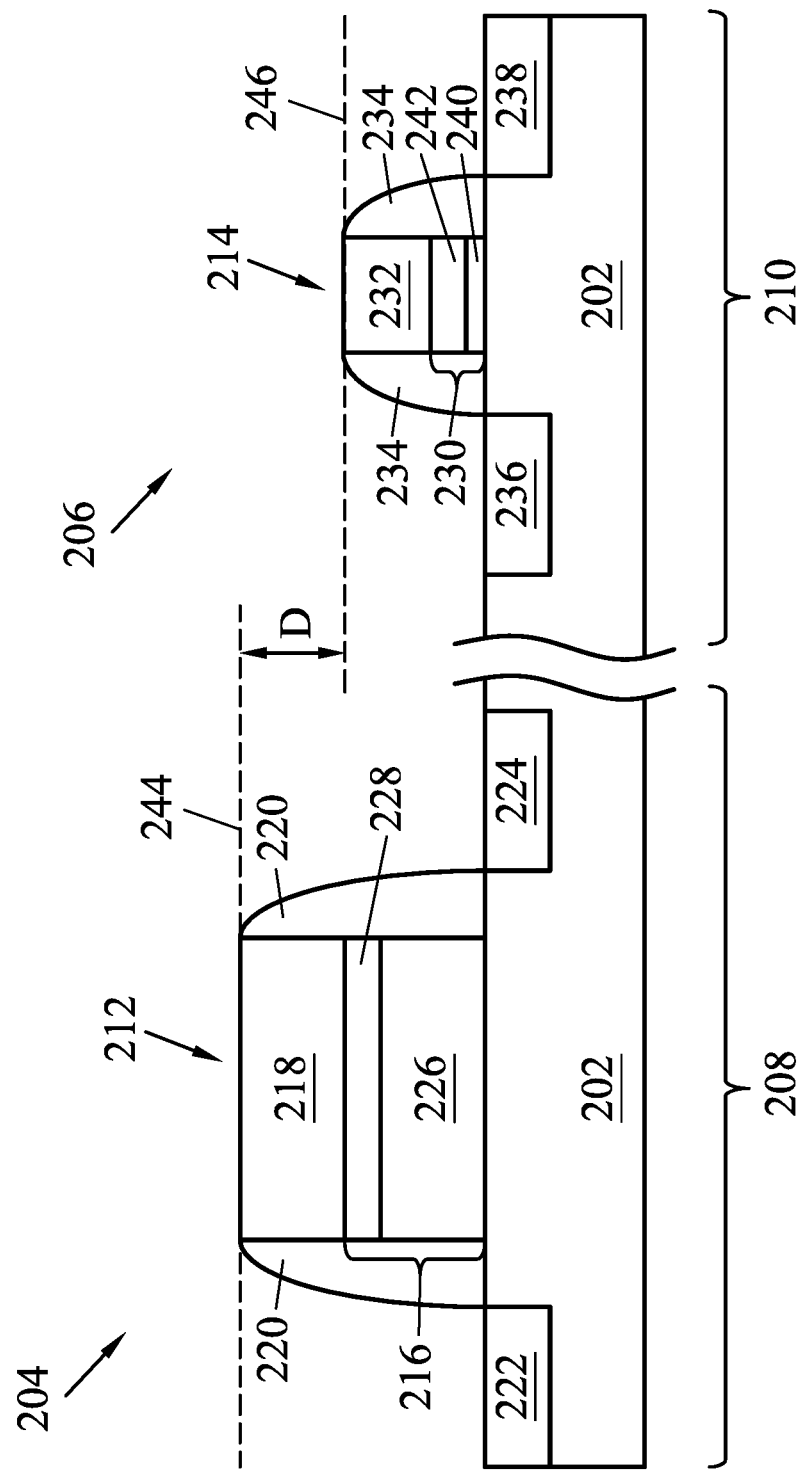
FIG. 2 illustrates a cross-section view of a semiconductor substrate including both a high-voltage transistor (HVT) and a low-voltage transistors (LVT)

In some embodiments, and depending on a particular device type being fabricated, various aspects of the transistor 100 may be appropriately modified (e.g., layer thicknesses, material type, doping configuration, etc.). In addition, some semiconductor substrates may include a variety of semiconductor device types. Thus, in some cases, a semiconductor substrate may include a variety of device types having a variety of layers thicknesses, material types, doping configurations, etc. With reference to FIG. 2, and as merely one example, a semiconductor substrate 202 may include both high-voltage transistors (HVTs), such as HVT 204, and low-voltage transistors (LVTs), such as LVT 206. In some cases, the HVT 204 may be formed within a high-voltage (HV) region 208 of the substrate 202, and the LVT 206 may be formed within a low-voltage (LV) region 210 of the same substrate 202. For purposes of this disclosure, the LV region 210 may equally be referred to as a logic region, and LVTs may be equally referred to as logic transistors. Additionally, in some examples, the LVTs may include core transistors, SRAM transistors, I/O transistors, or other devices that operate by using a substantially nominal voltage. Thus, in some examples, HVTs may include transistors or other devices operating at voltages higher than the LVTs. Additional parameters regarding HVTs and LVTs is described in more detail below.

In various examples, aspects of the HVT 204 and the LVT 206 may be similar to the transistor 100, described above. For example, the HVT 204 may include a gate stack 212 having a gate dielectric 216 and a metal gate 218, sidewall spacers 220, a source region 222, and a drain region 224. In some examples, the gate dielectric 216 may include a first dielectric layer 226 and a second dielectric layer 228. In some cases, the first dielectric layer 226 may include a silicon oxide layer ($SiO_2$) or silicon oxynitride (SiON), and the second dielectric layer 228 may include a high-k dielectric layer, as discussed above. Similarly, the LVT 206 may include a gate stack 214 having a gate dielectric 230 and a metal gate 232, sidewall spacers 234, a source region 236, and a drain region 238. In some examples, the gate dielectric 230 may include a first dielectric layer 240 and a second dielectric layer 242. In some cases, the first dielectric layer 240 may include a silicon oxide layer ($SiO_2$) or silicon oxynitride (SiON), and the second dielectric layer 242 may include a high-k dielectric layer, as discussed above. As shown in FIG. 2, and in various examples, the HVT 204 has a thicker gate dielectric 216 than the gate dielectric 230 of the LVT 206. As a result, the HVT gate stack 212 is taller than the LVT gate stack 214 (e.g., by a distance 'D'), and a top gate stack surface of the HVT 204 (e.g., denoted by dashed line 244) and a top gate stack surface of the LVT 206 (e.g., denoted by dashed line 246) are not co-planar with each other.

Figure 3:
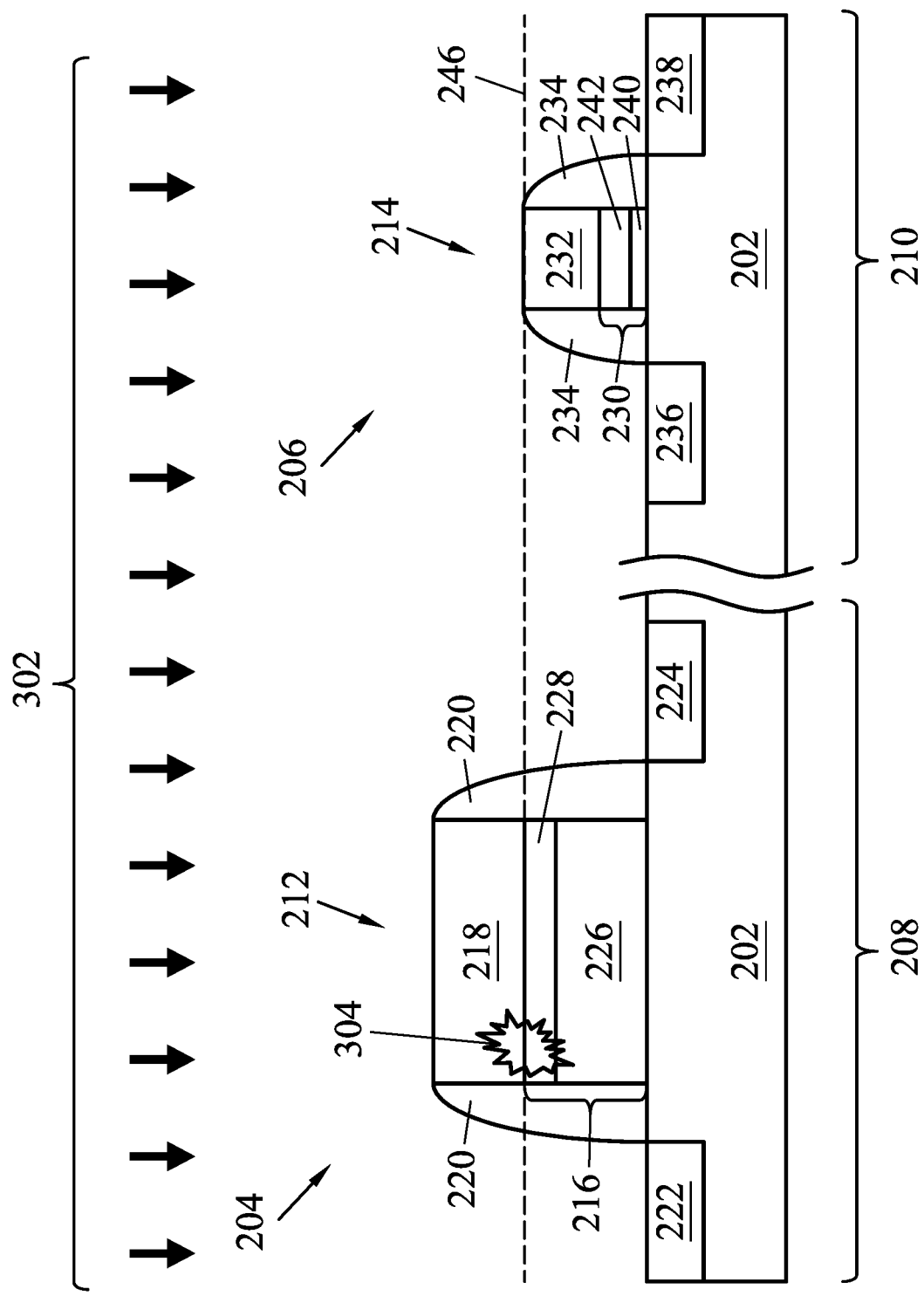
FIG. 3 illustrates performing a chemical mechanical polishing (CMP) process to the semiconductor substrate including both the HVT and the LVT of FIG. 2.

The difference in height of the HVT gate stack 212 and the LVT gate stack 214 can be particularly troublesome during a chemical mechanical polishing (CMP) process, which is a process that serves to remove substrate material and thereby planarize a top surface of the substrate. Consider the example of FIG. 3, which illustrates performing a CMP process 302 that polishes down to the top gate stack surface of the shorter LVT gate stack 214 (e.g., denoted by dashed line 246). In some examples, the illustrative CMP process may include a metal gate CMP process for the LVT gate stack 214. In various cases, polishing down to the top gate stack surface of the shorter LVT gate stack 214 may simultaneously over polish the taller HVT gate stack 212, thereby damaging (e.g., schematically illustrated by icon 304) one or both of the metal gate 218 and gate dielectric 216, including the high-K dielectric layer, of the HVT gate stack 212. In some cases, the extent of the damage to the metal gate 218 and the gate dielectric 216 may depend on the height difference 'D' between the HVT gate stack 212 and the LVT gate stack 214. In some examples, even when trying to minimize or restrict such CMP damage (e.g., by containing the over polishing to the metal gate 218), the resulting thickness of the metal gate 218 may no longer be thick enough, for example, because of the thick underlying gate dielectric 216. Moreover, thinning of the metal gate 218 by such over polishing can make work function tuning difficult. Thus, it would be desirable to provide a thick gate oxide, as used in HVTs, while being able to still fabricate an adequately thick metal gate and prevent over polishing of HVT gate stacks.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods of providing a gate dielectric, where at least part of the gate dielectric is provided within a trench disposed within the substrate. In some aspects, a gate oxide thickness (e.g., of a high-voltage transistor) may be controlled by way of a trench depth. By providing a HVT with a gate dielectric formed within a trench, embodiments of the present disclosure provide for the top gate stack surface of HVTs (e.g., the HVT 204) and the top gate stack surface of the LVTs (e.g., the LVT 206) to be substantially co-planar with each other, while providing a thick gate oxide for the HVTs. Further, because the top gate stack surface of HVTs and the top gate stack surface of the LVTs are substantially co-planar with each other, over polishing of HVT gate stacks can be avoided. In some embodiments, the gate stack thickness of HVTs in an HV region may be between about 400-750 Angstroms, and the gate stack thickness of LVTs in an LV region may be between about 250-500 Angstroms. In some embodiments, the top gate stack surface of HVTs (e.g., the HVT 204) and the top gate stack surface of the LVTs (e.g., the LVT 206) are co-planar to within about +/−100 Angstroms of each other. In some examples, in the HV region and thus for the HVTs, a ratio of the thickness of the metal gate to the thickness of the gate stack is between about 50-80%. In some embodiments, in the LV region and thus for the LVTs, a ratio of the thickness of the metal gate to the thickness of the gate stack is between about 80-98%. In various cases, one or more of the HVTs in the HV region and the LVTs in the LV region may be electrically connected to each other. In some embodiments, implementation of the gate dielectric trench disclosed herein may be accomplished by adding, for example to at least some existing processes, one additional photomask and one additional etch/deposition process. Those skilled in the art will recognize other benefits and advantages of the methods and devices as described herein, and the embodiments described are not meant to be limiting beyond what is specifically recited in the claims that follow.

Figure 4:
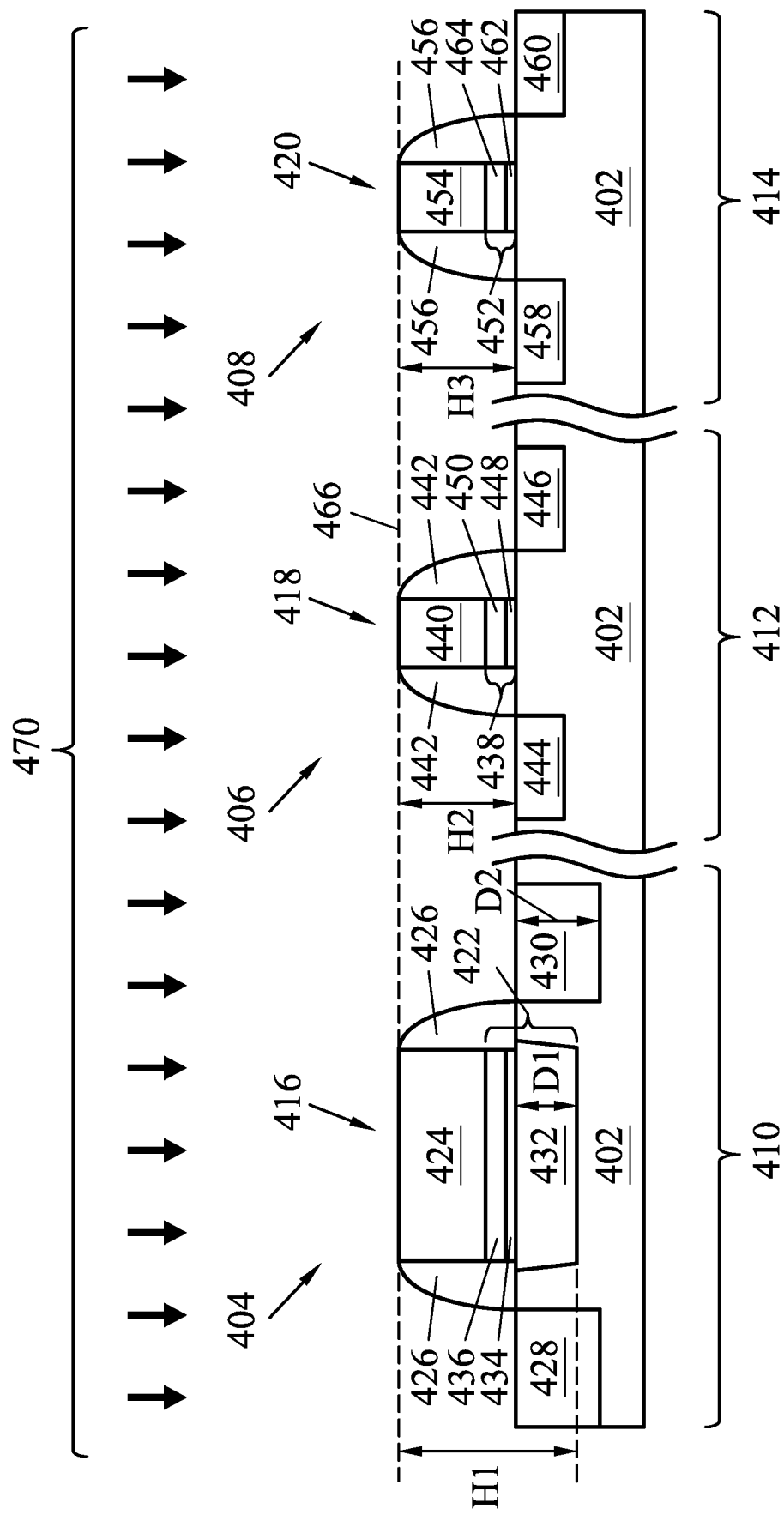
FIG. 4 illustrates a cross-section view of a semiconductor substrate including both a HVT and LVTs that have a substantially co-planar top surface, in accordance with some embodiments.

With reference now to FIG. 4, illustrated therein is a semiconductor substrate 402 including both high-voltage transistors (HVTs) and low-voltage transistors (LVTs) that have a substantially co-planar top surface, in accordance with some embodiments. In some embodiments, a HVT 404 may be formed within a high-voltage (HV) region 410 of the substrate 402, a LVT 406 may be formed within a first low-voltage (LV) region 412 of the substrate 402, and a LVT 408 may be formed within a second LV region 414 of the substrate 402. In various embodiments, the first LV region 412 and the second LV region 414 may be the same or different regions, and each of the first LV region 412 and the second LV region 414 may include various LVTs such as core transistors, SRAM transistors, I/O transistors, or other devices that operate by using a substantially nominal voltage. For purposes of the present example, consider that the HVT 404 includes a high-voltage metal-oxide-semiconductor (MOS) device, the LVT 406 includes a core transistor or SRAM transistor, and the LVT 408 includes an I/O transistor.

In some examples, certain aspects of the HVT 404, the LVT 406, and the LVT 408 may be similar to the transistor 100, the HVT 204, and the LVT 206, described above. However, in accordance with embodiments of the present disclosure, the HVT 404 includes a gate dielectric formed within a trench, as described below. In various embodiments, the HVT 404 may include a gate stack 416 having a gate dielectric 422 and a metal gate 424, sidewall spacers 426, a source region 428, and a drain region 430. In some examples, the gate dielectric 422 may include a first dielectric layer 432, a second dielectric layer 434, and a third dielectric layer 436. In some embodiments, the first dielectric layer 432 may include a high voltage dielectric layer. By way of example, a desired dielectric thickness for the HVT 404 is controlled in large part by a depth 'D1' of a trench into which material for the first dielectric layer 432 is deposited. In some embodiments, the first dielectric layer 432 may include a silicon oxide layer ($SiO_2$), silicon oxynitride (SiON), or other appropriate dielectric layer. In some examples, the second dielectric layer 434 may similarly include a silicon oxide layer ($SiO_2$), silicon oxynitride (SiON), or other appropriate dielectric layer. Moreover, in some embodiments, the second dielectric layer 434 may be the same as the first dielectric layer of the LVT 406 or the LVT 408, discussed below. In various embodiments, the third dielectric layer 436 may include a high-k dielectric layer, as discussed above. As discussed with reference to FIG. 1, a transistor channel region may be defined as the region between the source and drain regions under the gate dielectric and within the semiconductor substrate. Thus, in some embodiments, because the first dielectric layer 432 extends a depth 'D1' into the substrate 402, it may be desirable to extend the source region 428 and the drain region 430 further into the substrate (e.g., as compared to the source/drain regions of the LVT 406 and the LVT 408). In some embodiments, the source region 428 and the drain region 430 may extend a depth 'D2' into the substrate 402, where the depth 'D2' is greater than the depth 'D1'. In some embodiments, by extending the source region 428 and the drain region 430 into the substrate 402 to the depth 'D2' greater than the depth 'D1', the drive current developed for a given bias voltage for the HVT 404 may be preserved or enhanced.

In some embodiments, the LVT 406 may include a gate stack 418 having a gate dielectric 438 and a metal gate 440, sidewall spacers 442, a source region 444, and a drain region 446. In some examples, the gate dielectric 438 may include a first dielectric layer 448 and a second dielectric layer 450. Similarly, in some examples, the LVT 408 may include a gate stack 420 having a gate dielectric 452 and a metal gate 454, sidewall spacers 456, a source region 458, and a drain region 460. In some examples, the gate dielectric 452 may include a first dielectric layer 462 and a second dielectric layer 464. In some cases, each of the first dielectric layers 448 and 462 may include a silicon oxide layer ($SiO_2$) or silicon oxynitride (SiON), and each of the second dielectric layers 450 and 464 may include a high-k dielectric layer, as discussed above. In some embodiments, for example because the LVT 406 includes a core transistor or SRAM transistor and the LVT 408 includes an I/O transistor, the gate dielectric 452 of the LVT 408 may be thicker than the gate dielectric 438 of the LVT 406.

As shown in FIG. 4, and in various embodiments, the HVT 404 has a thicker gate dielectric 422 than either the gate dielectric 438 of the LVT 406 or the gate dielectric 452 of the LVT 408. Moreover, by forming the gate dielectric 422 largely within a trench, a thick gate dielectric and sufficiently thick metal gate may be provided for the HVT 404, while simultaneously ensuring that a top gate stack surface of the HVT 404, a top gate stack surface of the LVT 406, and a top gate stack surface of the LVT 408 are substantially co-planar with each other (e.g., as denoted by dashed line 466). In various embodiments, because the top gate stack surface of the HVT 404, the top gate stack surface of the LVT 406, and the top gate stack surface of the LVT 408 are substantially co-planar with each other, over polishing of HVT gate stack 416 may be avoided. In general, because the top gate stack surfaces of the HVT 404, the LVT 406, and the LVT 408 are substantially co-planar with each other, an exemplary CMP process 470 that polishes down to the top gate stack surface of the gate stack 416, the gate stack 418, or the gate stack 420 will not over polish any of the other gate stacks. In some examples, the illustrative CMP process 470 may include a metal gate CMP process for the LVT 406 or the LVT 408. Thus, in some embodiments, a CMP process that polishes down to a top surface of the metal gate 440 or a top surface of the metal gate 454 will not over polish the gate stack 416, but rather a thickness of the metal gate 424 may remain substantially unchanged.

In some embodiments, the thickness/height 'H1' of the gate stack 416 may be between about 400-750 Angstroms, the thickness/height 'H2' of the gate stack 418 may be between about 250-500 Angstroms, and the thickness/height 'H3' of the gate stack 420 may be between about 250-500 Angstroms. By way of example, and with reference to the gate stack 416, the thickness of the first dielectric layer 432 may be between about 100-200 Angstroms, the thickness of the second dielectric layer 434 may be between about 20-50 Angstroms, the thickness of the third dielectric layer 436 may be between about 10-50 Angstroms, and the thickness of the metal gate 424 may be between about 200-500 Angstroms. Thus, in various embodiments, the ratio between the thickness of the second dielectric layer 434 and the first dielectric layer 432 may be between about $\frac{1}{10}$-$\frac{1}{2}$. With reference to the gate stack 418, the thickness of the first dielectric layer 448 may be between about 10-30 Angstroms, the thickness of the second dielectric layer 450 may be between about 10-50 Angstroms (and may be same as the third dielectric layer 436), and the thickness of the metal gate 440 may be between about 200-500 Angstroms. Referring to the gate stack 420, the thickness of the first dielectric layer 462 may be between about 20-50 Angstroms (and may be same as the second dielectric layer 434), the thickness of the second dielectric layer 464 may be between about 10-50 Angstroms (and may be same as the third dielectric layer 436), and the thickness of the metal gate 454 may be between about 200-500 Angstroms. In some embodiments, the top gate stack surface of the HVT 404, the top gate stack surface of the LVT 406, and the top gate stack surface of the LVT 408 are co-planar to within about +/−100 Angstroms of each other. In some embodiments, and for the HVT 404, a ratio of the thickness of the metal gate 424 to the thickness/height 'H1' of the gate stack 416 is between about 50-80%. In some embodiments, and for the LVT 406, a ratio of the thickness of the metal gate 440 to the thickness/height 'H2' of the gate stack 418 is between about 80-98%. Similarly, for the LVT 408 and in some embodiments, a ratio of the thickness of the metal gate 454 to the thickness/height 'H3' of the gate stack 420 is between about 80-98%. For purposes of this disclosure, the thickness/height 'H1' of the gate stack 416 may be substantially equal to a gate height specification for a high-voltage MOS device, the thickness/height 'H2' of the gate stack 418 may be substantially equal to a gate height specification for a core transistor or SRAM transistor, and the thickness/height 'H3' of the gate stack 420 may be substantially equal to a gate height specification for an I/O transistor. Additionally, and in some embodiments, one or more of the HVT 404, the LVT 406, and the LVT 408 may be electrically connected to each other (e.g., through an electrical interconnect network).

Figure 5:
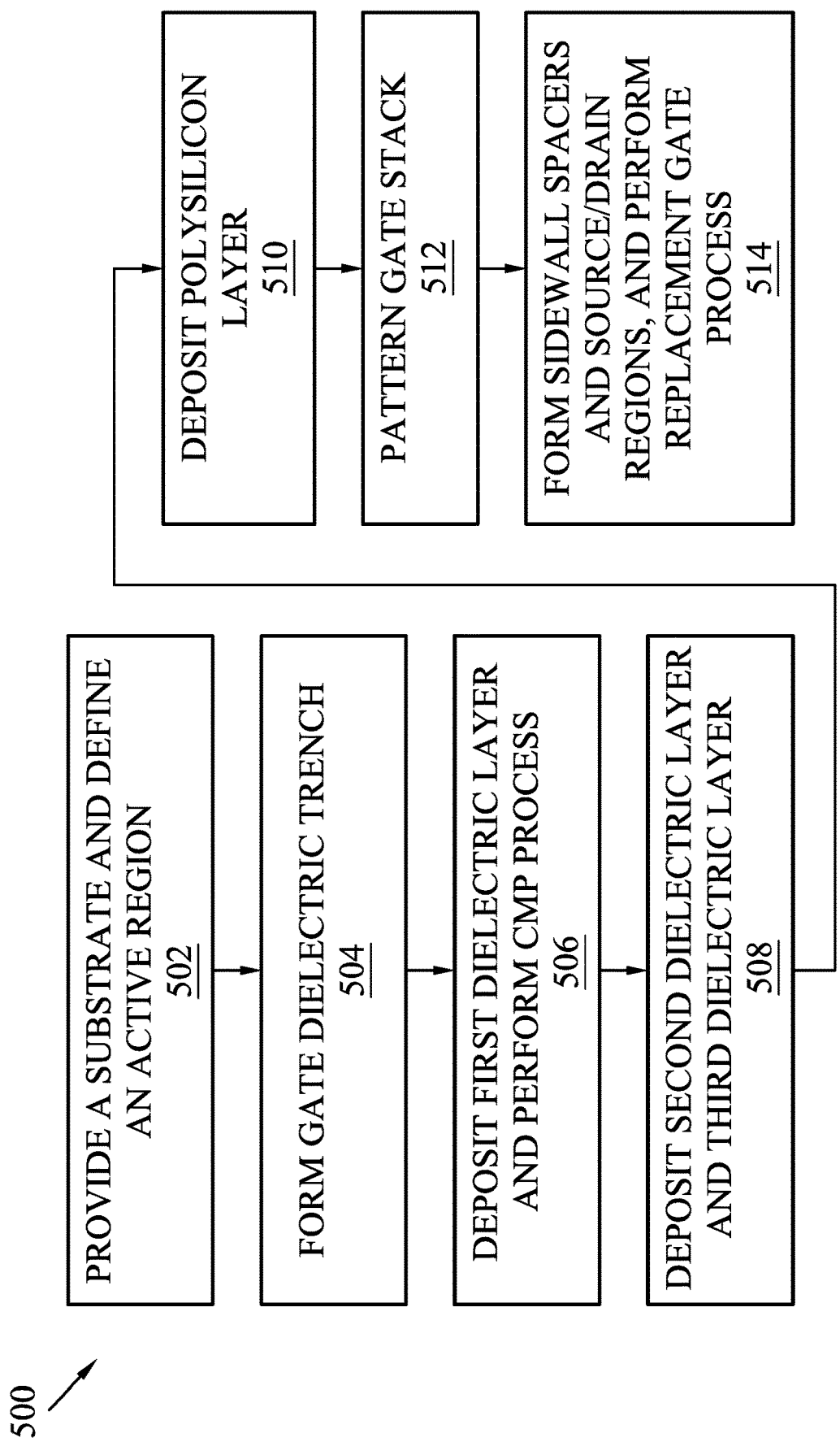
FIG. 5 illustrates a method of fabricating a semiconductor device including a high-voltage transistor (HVT), according to some embodiments.
Figure 8:
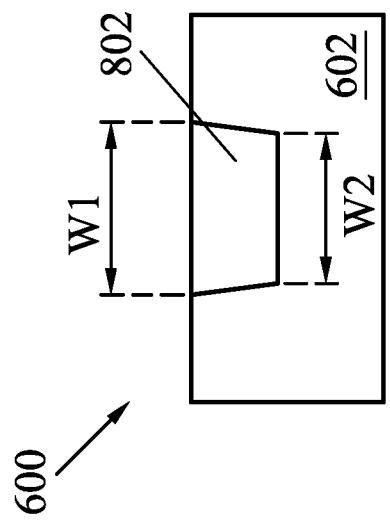
FIGS. 6, 7, 8, 9, 10, 11, and 12 are cross-section views of an exemplary device fabricated according to one or more steps of the method of FIG. 5.
Figure 7:
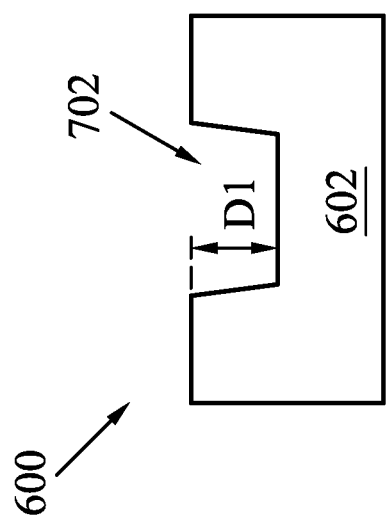

Referring now to FIG. 5, illustrated is a method 500 of fabricating a semiconductor device including a high-voltage transistor (HVT). The method 500 may be used to fabricate a gate stack of the HVT, where at least part of the gate dielectric of the HVT is disposed in a trench within the substrate. In some embodiments, the method 500 may be used to fabricate the device 404, described above with reference to FIG. 4. Moreover, in some embodiments, the method 500 may be used to fabricate HVTs (e.g., such as the HVT 404) on the same substrate as various types of LVTs, such as the LVT 406 and the LVT 408. Thus, one or more aspects discussed above may also apply to the method 500. Additionally, FIGS. 6-12 are cross-section views of an exemplary device 600 fabricated according to one or more steps of the method 500 of FIG. 5.

It is understood that parts of the method 500 of FIG. 5 and/or the semiconductor device 600 may be fabricated by a well-known complementary metal-oxide-semiconductor (CMOS) technology process flow, and thus some processes are only briefly described herein. Further, the semiconductor device 600 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 600 includes a plurality of semiconductor devices (e.g., transistors), which may be interconnected.

The device 600 fabricated in accordance with embodiments of this disclosure may further be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof. In addition, though the method 500 is described in the context of a MOSFET device, it is understood that the embodiments described herein may apply to other structures of transistors including, for example, strained-semiconductor devices, silicon-on-insulator (SOI) devices, partially-depleted SOI devices, fully-depleted SOI devices, or other devices as known in the art.

Figure 6:
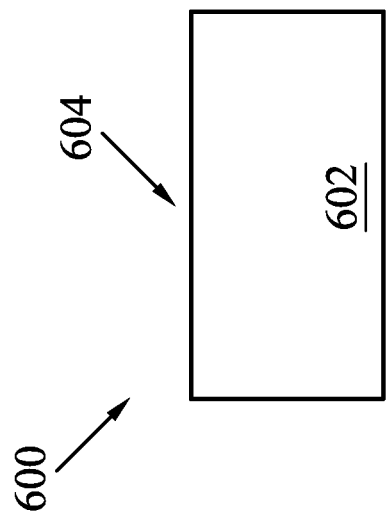
Figure 9:
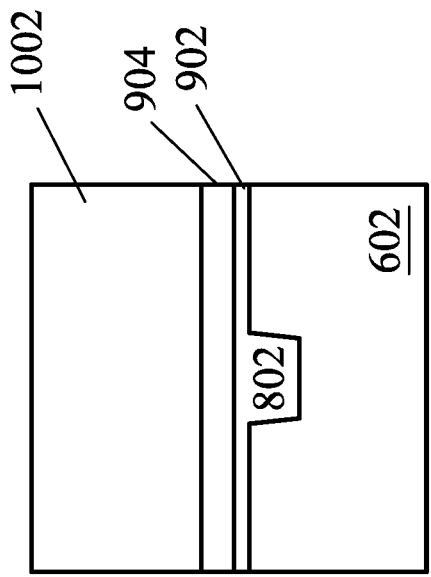
Figure 10:
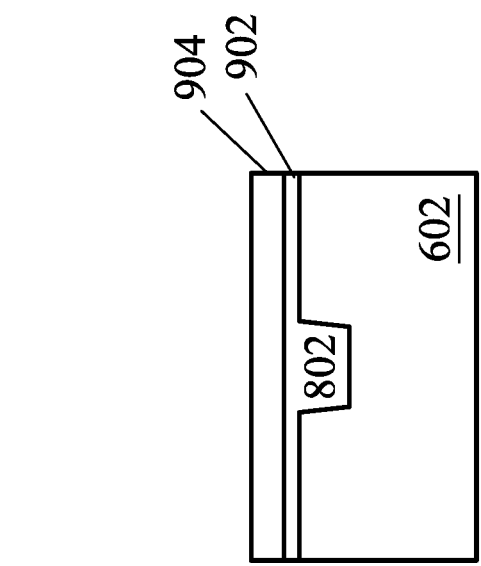
Figure 11:
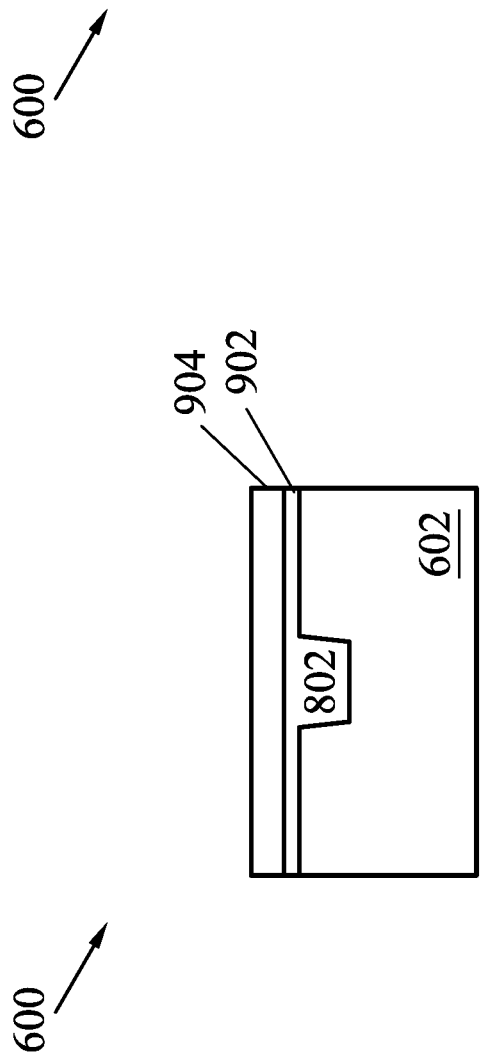

Referring now to the method 500, the method 500 begins at block 502 where a substrate is provided and an active region is defined. Referring to the example of FIG. 6, illustrated is a semiconductor device 600 including a semiconductor substrate 602 upon which an active region 604 has been defined. As used herein, the term "active region" may be used to define a region in which a transistor (e.g., such as a HVT or a LVT) is formed, for example, as opposed to an isolation region (e.g., a shallow-trench isolation region, a field-oxide region, or other isolation region) that may be disposed adjacent to an active region or between adjacent active regions. In some embodiments, the substrate 602 may be substantially similar to the substrate 102 or the substrate 402, discussed above with reference to FIG. 1 and FIG. 4, respectively.

The method 500 proceeds to block 504 where a gate dielectric trench is formed. Referring to the example of FIG. 7, a gate dielectric trench 702 is formed within the substrate 602. In various embodiments, the gate dielectric trench 702 may be formed using a photolithography and etching process. By way of example, and in some embodiments, a photoresist layer (resist) may be deposited over the substrate 602, the resist may be exposed to a pattern (e.g., which defines the trench 702), a post-exposure bake process may be performed, and the resist may be developed to form a masking element including a patterned resist layer. In some embodiments, pattering the resist to form the masking element may be performed using an electron beam (e-beam) lithography process, an EUV lithography process, an immersion lithography process, or other suitable lithography process. The masking element (e.g., the patterned resist layer) may then be used to protect regions of the substrate 602 while an etch process forms the gate dielectric trench 702 within the substrate 602. In various embodiments, the etch process may include a dry etch, a wet etch, or a combination thereof. In some embodiments, the trench may be etched to a depth 'D1', as previously discussed. Moreover, in various embodiments, the depth 'D1' of the trench 702 may be controlled (e.g., by controlling the etch process) so as to provide a desired dielectric thickness for the subsequently formed HVT. Stated another way, in some embodiments, the depth 'D1' of the trench 702 is selected so as to provide an adequately thick gate oxide for the HVT. In some cases, the depth 'D1' of the trench 702 is measured from a plane parallel to a top surface of the substrate 602 (e.g., a non-etched portion of the substrate 602) to a bottom surface of the trench 702. In some embodiments, a trench width 'W1' (FIG. 8) may also be defined during the photolithography and etching process. In some examples, the trench width 'W1' may be equal to about a width of a gate stack of the HVT. In some embodiments, the etch process used to form the trench 702 may result in sloped sidewalls of the trench 702, such that the trench has a width 'W2' (FIG. 8) at the bottom of the trench 702, where the width 'W2' is less than the width 'W1'.

The method 500 proceeds to block 506 where a first dielectric layer is deposited and a CMP process is performed. Referring to the example of FIGS. 7 and 8, a first dielectric layer 802 is deposited over the substrate 602 and into the trench 702. In some embodiments, after deposition of the first dielectric layer 802, a CMP process is performed to remove excess material of the first dielectric layer 802 and to planarize a top surface of the device 600. In some embodiments, the first dielectric layer 802 may include a silicon oxide layer ($SiO_2$), silicon oxynitride (SiON), or other appropriate dielectric layer. In some cases, the first dielectric layer 802 may be similar to the first dielectric layer 432, discussed above. In some embodiments, after the CMP process, a top surface of the first dielectric layer 802 is substantially co-planar with a top surface of the substrate 602 (e.g., a non-etched portion of the substrate 602), and a bottom surface of the first dielectric layer 802 extends into the substrate 602 by the distance 'D1'.

The method 500 proceeds to block 508 where a second dielectric layer and a third dielectric layer are deposited. Referring to the example of FIGS. 8 and 9, a second dielectric layer 902 is deposited over the substrate 602, including over the first dielectric layer 802. Additionally, in various embodiments, a third dielectric layer 904 may be deposited over the second dielectric layer 902. In some examples, the second dielectric layer 902 may include a silicon oxide layer ($SiO_2$), silicon oxynitride (SiON), or other appropriate dielectric layer. In some embodiments, the third dielectric layer 904 may include a high-k dielectric layer, as discussed above. In some embodiments, the second dielectric layer 902 includes a thin dielectric layer (e.g., such as used in a core, SRAM, or I/O transistor, or other LVT). In some embodiments, the third dielectric layer 904 may additionally include a TiN layer, such that the third dielectric layer 904 includes a high-k/TiN stack. In some cases, the second dielectric layer 902 may be similar to the second dielectric layer 434, and the third dielectric layer 904 may be similar to the third dielectric layer 436, both discussed above. In various embodiments, the first dielectric layer 802, the second dielectric layer 902, and the third dielectric layer 904 may include one or more of the dielectric materials described above with reference to the gate dielectric 106 of the MOS transistor 100.

The method 500 proceeds to block 510 where a polysilicon layer is deposited. Referring to the example of FIGS. 9 and 10, a polysilicon layer 1002 is deposited over the third dielectric layer 904. Thereafter, the method 500 proceeds to block 512 where a gate stack is patterned. With reference to the example of FIGS. 10 and 11, a photolithography and etching processes may be performed to pattern a gate stack 1102 of the device 600. In some embodiments, the photolithography and etching process is used to form the gate stack 1102 by patterning each of the polysilicon layer 1002, the third dielectric layer 904, and the second dielectric layer 902. Thus, the patterned gate stack 1102 may include a patterned polysilicon layer 1002A, a patterned third dielectric layer 904A, and a patterned second dielectric layer 902A. In some cases, the patterning and etching of block 512 is performed so as to align the patterned gate stack 1102 with (e.g., have a similar width as) the previously defined gate dielectric trench 702. Thus, in some embodiments, the patterned gate stack 1102 may have a width substantially equal to the trench width 'W1'.

Figure 12:
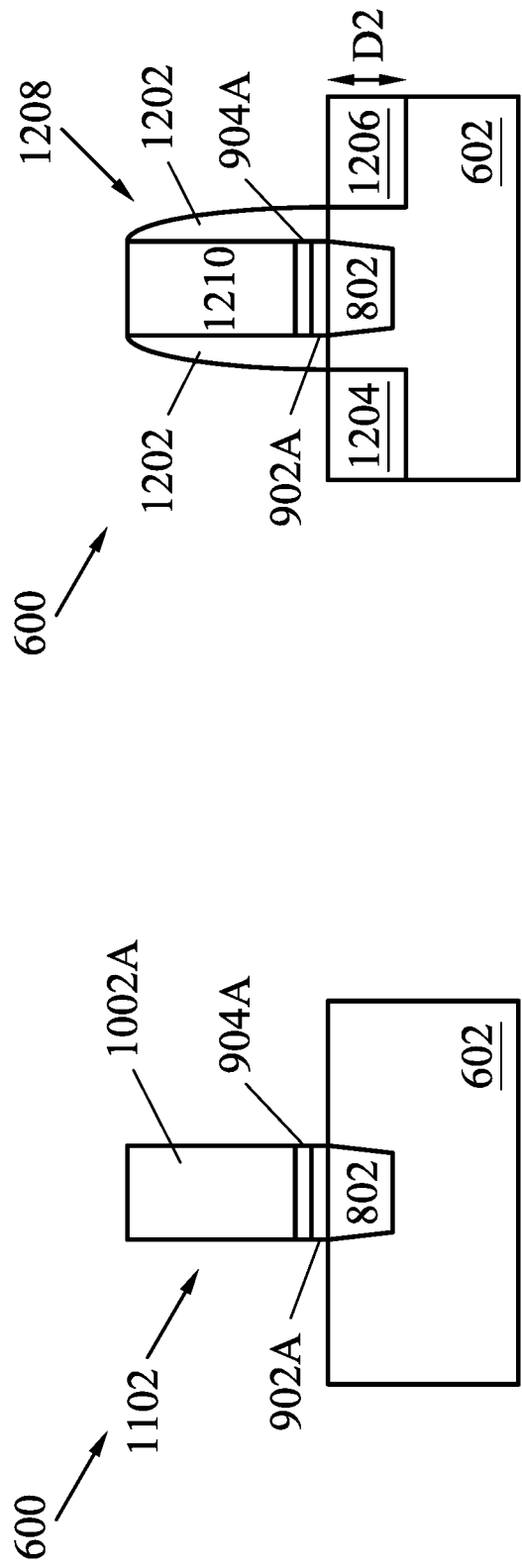

The method 500 proceeds to block 514 where sidewall spacers and source/drain regions are formed, and where a replacement gate process is performed. Referring to the example of FIG. 12, sidewall spacers 1202 are formed. In some embodiments, the sidewall spacers 1202 may include a dielectric material such as silicon oxide, silicon nitride, silicon carbide, silicon oxynitride, or combinations thereof. In some embodiments, the sidewall spacers 1202 include multiple layers, such as main spacer walls, liner layers, and the like. As also illustrated in the example of FIG. 12, a source region 1204 and a drain region 1206 are formed within the substrate 602 and on either side of gate stack 1208. In addition, the source region 1204 and the drain region 1206 are formed within the substrate 602 and on either side of the trench 702 including the first dielectric layer 802. In various embodiments, the source region 1204 and the drain region 1206 may include diffused source/drain regions, ion implanted source/drain regions, epitaxially grown regions, or a combination thereof. In a further embodiment of block 514, and with reference to FIGS. 11 and 12, a replacement gate process is performed. In the replacement gate process, the patterned polysilicon layer 1002A may be removed (e.g., by a selective wet etch or a selective dry etch) and a metal gate layer 1210 may then be deposited over the patterned third dielectric layer 904A. In some embodiments, the metal gate layer 1210 includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the metal gate layer 1210 may include a first metal material for an N-type device 600 and a second metal material for a P-type device 600. It is also noted that in some embodiments, the sidewall spacers 1202 may be formed on sidewalls of the patterned gate stack 1102 (FIG. 11) prior to performing the replacement gate process.

Similar to the discussion of FIG. 4, and with reference to FIG. 12, because the first dielectric layer 802 extends a depth 'D1' into the substrate 602, it may be desirable to extend the source region 1204 and the drain region 1206 further into the substrate. Thus, in some embodiments, the source region 1204 and the drain region 1206 may extend a depth 'D2' into the substrate 602, where the depth 'D2' is greater than the depth 'D1'. In various embodiments, by extending the source region 1204 and the drain region 1206 into the substrate 602 to the depth 'D2' greater than the depth 'D1', the drive current developed for a given bias voltage for the device 600 may be preserved or enhanced. It is also noted that because embodiments of the present disclosure provide for the thick gate oxide (the first dielectric layer 802) of the HVT device 600 to be buried within the trench 702, a top surface of the gate stack 1208 is effectively lowered. As a result, embodiments of the present disclosure provide for a top gate stack surface of the HVTs and LVTs to be substantially co-planar with each other, while providing a thick gate oxide for the HVTs (e.g., as shown in FIG. 4).

The semiconductor device 600 may undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more transistor devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multi-layer interconnection structure. Moreover, additional process steps may be implemented before, during, and after the method 500, and some process steps described above may be replaced or eliminated in accordance with various embodiments of the method 500.

The various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods of providing a gate dielectric, where at least part of the gate dielectric is provided within a trench disposed within the substrate. In some aspects, a gate oxide thickness (e.g., of a high-voltage transistor) may be controlled by way of a trench depth. By providing a HVT with a gate dielectric formed within a trench, embodiments of the present disclosure provide for the top gate stack surface of HVTs and the top gate stack surface of the LVTs to be substantially co-planar with each other, while providing a thick gate oxide for the HVTs. Further, because the top gate stack surface of HVTs and the top gate stack surface of the LVTs are substantially co-planar with each other, over polishing of HVT gate stacks can be avoided.

Thus, one of the embodiments of the present disclosure described a method for fabricating a semiconductor device including forming a gate dielectric trench within a substrate and depositing a first dielectric layer within the gate dielectric trench. In some embodiments, a top surface of the first dielectric layer is co-planar with a top surface of the substrate. Thereafter, in some examples, a second dielectric layer is formed over the first dielectric layer. In some embodiments, a metal gate is then formed over the second dielectric layer.

In another of the embodiments, discussed is a method where a first transistor is formed within a first region of a substrate. In some embodiments, the first transistor includes a first gate stack having a first height. In various examples, a second transistor is formed within a second region of the substrate. In some embodiments, the second transistor includes a second gate stack having a second height less than the first height. In some cases, a top surface of the first gate stack is substantially co-planar with a top surface of the second gate stack.

In yet another of the embodiments, discussed is a semiconductor device including a substrate having a gate dielectric trench and a first dielectric layer formed within the gate dielectric trench. In some embodiments, a top surface of the first dielectric layer is co-planar with a top surface of the substrate. In various examples, a second dielectric layer is disposed over the first dielectric layer, and a metal gate is disposed over the second dielectric layer. In some cases, the first dielectric layer and the second dielectric layer provide a gate oxide of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a gate dielectric layer in a trench within an active region of a substrate, the active region being free of any shallow trench isolation feature, the trench having a first depth, and the gate dielectric layer having a top surface that is level with a top surface of the substrate;
    forming another gate dielectric layer over the gate dielectric layer, the another gate dielectric layer disposed outside the trench; and
    forming a source region and a drain region within the substrate and on either side of the trench, wherein the source region and the drain region extend into the substrate a second depth greater than the first depth.

2. The method of claim 1, wherein the trench has a first width along a plane parallel to the top surface of the substrate, and wherein the trench has a second width along a plane parallel to a bottom surface of the trench, wherein the second width is less than the first width.

3. The method of claim 2, wherein the gate dielectric layer and the another gate dielectric layer form part of a gate stack of a transistor disposed within the active region, and wherein the first width is substantially equal to a width of the gate stack of the transistor.

4. The method of claim 1, further comprising:
    after forming the another dielectric layer, forming a metal gate layer over the another dielectric layer.

5. The method of claim 1, further comprising:
    after forming the gate dielectric layer and prior to forming the another gate dielectric layer, performing a chemical mechanical polishing process to remove excess material of the gate dielectric layer and to planarize the top surface of substrate.

6. The method of claim 4, further comprising:
    after depositing the another gate dielectric layer and prior to forming the metal gate layer, forming a high-k dielectric layer over the another gate dielectric layer.

7. The method of claim 4, further comprising:
    prior to forming the metal gate, forming a polysilicon layer over the another gate dielectric layer.

8. The method of claim 7, further comprising:
    patterning the polysilicon layer to form a patterned polysilicon layer, patterning the another gate dielectric layer to form a patterned another gate dielectric layer, removing the patterned polysilicon layer, and forming the metal gate layer over the patterned another gate dielectric layer.

9. The method of claim 4, wherein the gate dielectric layer, the another gate dielectric layer and the metal gate layer form part of a high-voltage transistor (HVT) disposed within the active region.

10. A method, comprising:
    forming a first transistor within a first active region of a substrate, the first transistor having a first gate stack; and
    forming a second transistor within a second active region of the substrate, the second transistor having a second gate stack, and the first and second active regions free of any shallow trench isolation feature;
    wherein an oxide layer of the first gate stack extends into the substrate.

11. The method of claim 10, wherein a first height of the first gate stack is greater than a second height of the second gate stack.

12. The method of claim 10, wherein a top surface of the first gate stack is level with a top surface of the second gate stack.

13. The method of claim 10, further comprising:
    forming a first source/drain region within the substrate adjacent to the first gate stack, wherein the oxide layer of the first gate stack extends into the substrate by a first depth, and wherein the first source/drain region extends into the substrate a second depth greater than the first depth.

14. The method of claim 13, further comprising:
    forming a second source/drain region within the substrate adjacent to the second gate stack, wherein the second source/drain region extends into the substrate a third depth less than the second depth.

15. The method of claim 10, wherein the forming the first transistor having the first gate stack further comprises:
    forming a trench within the first active region of the substrate; and
    forming the oxide layer of the first gate stack within the trench.

16. The method of claim 10, wherein forming the first transistor further includes forming a high-voltage transistor (HVT) within the first active region of the substrate, and wherein forming the second transistor further includes forming a low-voltage transistor (LVT) within the second active region of the substrate.

17. A method comprising:
    forming a transistor within an active region of a substrate, the active region being free of any shallow trench isolation feature, wherein forming the transistor includes:
    forming a trench, within the active region, filled with a first oxide layer having a top surface level with a top surface of the substrate; and
    forming a gate electrode over the first oxide layer;
    wherein a bottom surface of the first oxide layer is spaced a first distance from the top surface of the substrate, the first distance less than a second distance between the top surface of the substrate and a bottom surface of an adjacent source or drain feature of the transistor.

18. The method of claim 17, further comprising:
prior to forming the gate electrode, forming a second oxide layer over the first oxide layer, the second oxide layer disposed outside the trench; and
forming the gate electrode over the second oxide layer.

19. The method of claim 17, wherein first oxide layer and the gate electrode form part of a first gate stack of the transistor, the first gate stack having a first height that is greater than a second height of a second gate stack of another transistor disposed in an adjacent active region of the substrate.

20. The method of claim 19, wherein top surfaces of the first gate stack and the second gate stack are level with each other.

* * * * *